(12) United States Patent  
Kim et al.

(10) Patent No.: US 8,344,399 B2  
(45) Date of Patent: Jan. 1, 2013

(54) LED PACKAGE WITH WIDE EMISSION RANGE AND EFFECTIVE HEAT DISSIPATION

(75) Inventors: Hak Hwan Kim, Gyunggi-do (KR); Sung Kyong Oh, Gyunggi-do (KR); Soo Jin Jung, Seoul (KR); Hyung Kun Kim, Gyunggi-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 220 days.

(21) Appl. No.: 12/630,477

(22) Filed: Dec. 3, 2009

(65) Prior Publication Data

US 2010/0148201 A1  Jun. 17, 2010

(30) Foreign Application Priority Data

Dec. 17, 2008  (KR) .................. 10-2008-0128885

(51) Int. Cl.  
  *H01L 33/00*  (2010.01)

(52) U.S. Cl. ....... 257/98; 257/91; 257/99; 257/E33.057; 257/E33.058

(58) Field of Classification Search .......... 257/91, 257/E33.056–E33.058, 98, 99  
See application file for complete search history.

(56) References Cited

U.S. PATENT DOCUMENTS

| 6,188,130 | B1 * | 2/2001 | Ramirez et al. ............... 257/706 |
| 6,274,924 | B1 | 8/2001 | Carey et al. |
| 7,736,920 | B1 * | 6/2010 | Wu et al. ......................... 438/22 |
| 2006/0157726 | A1 * | 7/2006 | Loh et al. ...................... 257/100 |
| 2007/0097692 | A1 | 5/2007 | Suehiro et al. |
| 2008/0089072 | A1 | 4/2008 | Kim et al. |

FOREIGN PATENT DOCUMENTS

| JP | 2004-247701 | 9/2004 |
| JP | 2005-093097 | 4/2005 |
| JP | 2007-150268 | 6/2007 |
| JP | 2007-227693 | 9/2007 |
| JP | 2008-041290 | 2/2008 |
| JP | 2008-041950 | 2/2008 |
| JP | 2008-098600 | 4/2008 |
| WO | WO 2008/043264 | 4/2008 |

OTHER PUBLICATIONS

Japanese Office Action, and English translation thereof, issued in Japanese Patent Application No. 2009-282871 dated Jan. 10, 2012.

* cited by examiner

*Primary Examiner* — John C Ingham  
(74) *Attorney, Agent, or Firm* — McDermott Will & Emery LLP

(57) ABSTRACT

There is provided an LED package including: a body unit; an LED chip mounted onto the body unit; lead frames mounted onto the body unit and electrically connected to the LED chip; and a reflection unit having a cavity to receive the LED chip therein and reflecting light emitted from the LED chip to the outside. Here, the reflection unit has a curved cross-section.

8 Claims, 5 Drawing Sheets

LED PACKAGE WITH WIDE EMISSION RANGE AND EFFECTIVE HEAT DISSIPATION

CROSS-REFERENCE TO RELATED APPLICATIONS

This application claims the priority of Korean Patent Application No. 10-2008-0128885 filed on Dec. 17, 2008, in the Korean Intellectual Property Office, the disclosure of which is incorporated herein by reference.

BACKGROUND OF THE INVENTION

1. Field of the Invention

The present invention relates to LED packages, and more particularly, to an LED package that is electrically mounted onto an electronic apparatus so as to emit light.

2. Description of the Related Art

Recently, light emitting diodes (LEDs) that use compound semiconductor materials, such as GaAs, GaN or AlGaInP, have been developed to thereby implement light sources of various colors.

The characteristics of LED products are determined by several factors, such as color, luminance and light conversion efficiency. The characteristics of these LED products are primarily determined by the compound semiconductor materials used to manufacture LED devices and structures thereof. Secondarily, the characteristics of the LED products are greatly affected by the configurations of packages used for mounting LED chips therein.

In particular, in the LED application field requiring high luminance, including LEDs for lighting and electronic apparatuses, techniques that extract the maximum amount of light emitted from LED chips to the outside play a vital role. In order to meet this technical demand, techniques that emit the maximum amount of light from LED chips to the outside are required.

Further, as LED packages have been applied to diverse fields such as indoor/outdoor illumination, headlights or backlight units of liquid crystal displays (LCDs), high levels of efficiency and high heat dissipation characteristics are being required.

Heat generated from LED chips may not be effectively dissipated from LED packages, increasing the temperatures of the LED chips. As a result, the characteristics of the LED chips are deteriorated, and the life span thereof is reduced. Therefore, there has been an increasing need for a new method of effectively dissipating the heat generated by LED chips in high-power LED packages.

SUMMARY OF THE INVENTION

An aspect of the present invention provides an LED package that has a wide emission range and high light emission efficiency to emit the maximum amount of light from an LED chip to the outside.

According to an aspect of the present invention, there is provided an LED package including: a body unit; an LED chip mounted onto the body unit; lead frames mounted onto the body unit and electrically connected to the LED chip; and a reflection unit having a cavity to receive the LED chip therein and reflecting light emitted from the LED chip to the outside, wherein the reflection unit has a curved cross-section.

The reflection unit may have a semicircular cross-section.

The reflection unit may have a cross-section having rounded edges and a flat top.

The body unit may include a plurality of thermal pins protruding from an outer circumferential surface thereof in a radial manner.

Molding materials filling spaces may be created between the thermal pins, and molding materials may be injected between the filling spaces, into the bottom of the body unit and the top of the body unit and between the lead frames.

The molding materials may fill in parts of the molding materials filling spaces to expose the ends of the thermal pins.

Each of the lead frames may include a mounting portion provided on the upper side of the body unit, an outer bent portion extending in a perpendicular direction from the end of the mounting portion, and a lower bent portion extending in the perpendicular direction from the end of the outer bent portion.

A molding fixing unit may be further provided onto an upper surface of each of the lead frames so that the lead frame is fixed to the body unit.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

An LED package according to the invention will be described in detail with reference to FIGS. 1 through 6. Exemplary embodiments of the present invention will now be described in detail with reference to the accompanying drawings.

The invention may, however, be embodied in many different forms and should not be construed as limited to the embodiments set forth herein. Rather, these embodiments are provided so that this disclosure will be thorough and complete, and will fully convey the scope of the invention to those skilled in the art.

Figure 1:
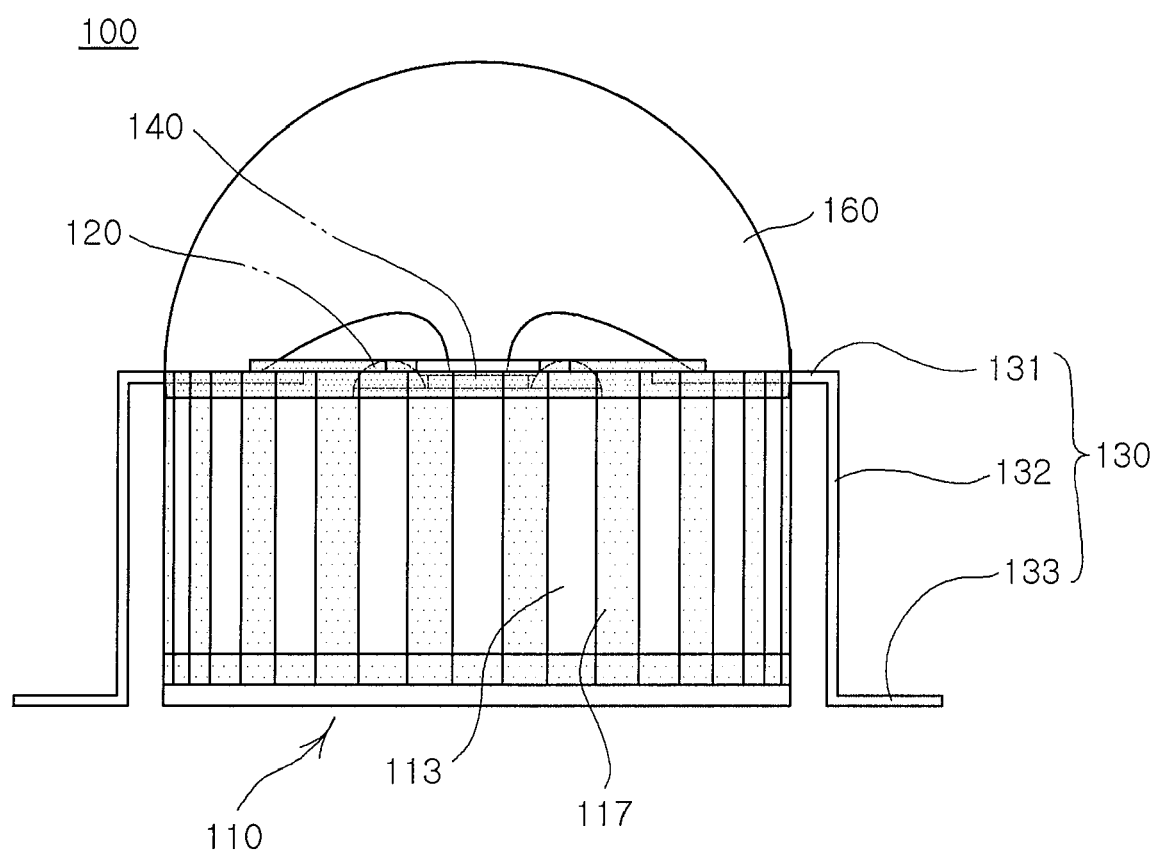
FIG. 1 is a lateral view illustrating an LED package according to an exemplary embodiment of the present invention.
Figure 2A:
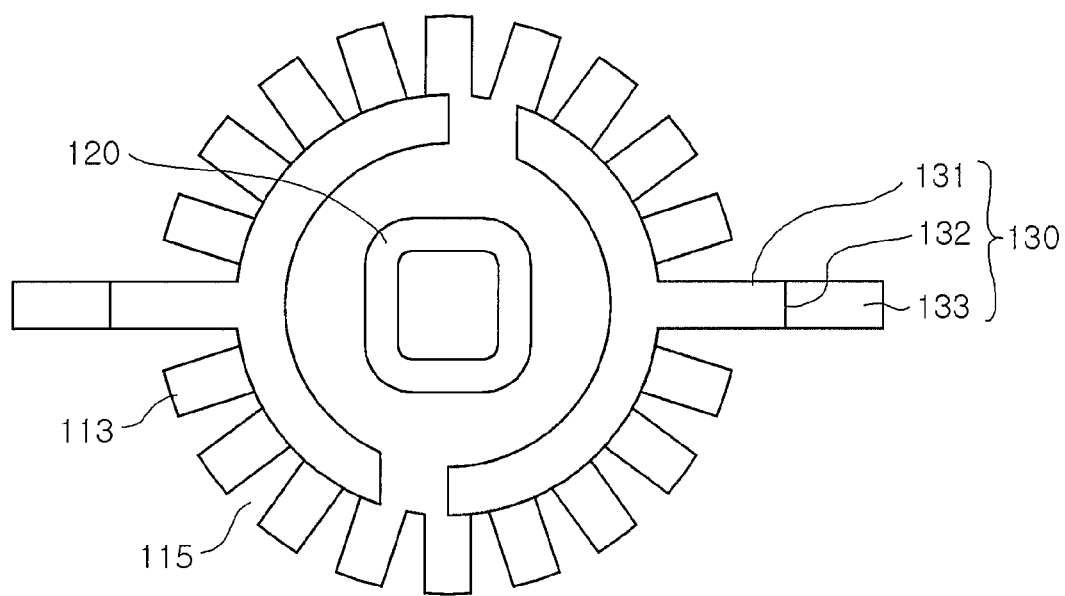
FIG. 2A is a view illustrating the LED package, shown in FIG. 1, before a molding unit is filled.
Figure 2B:
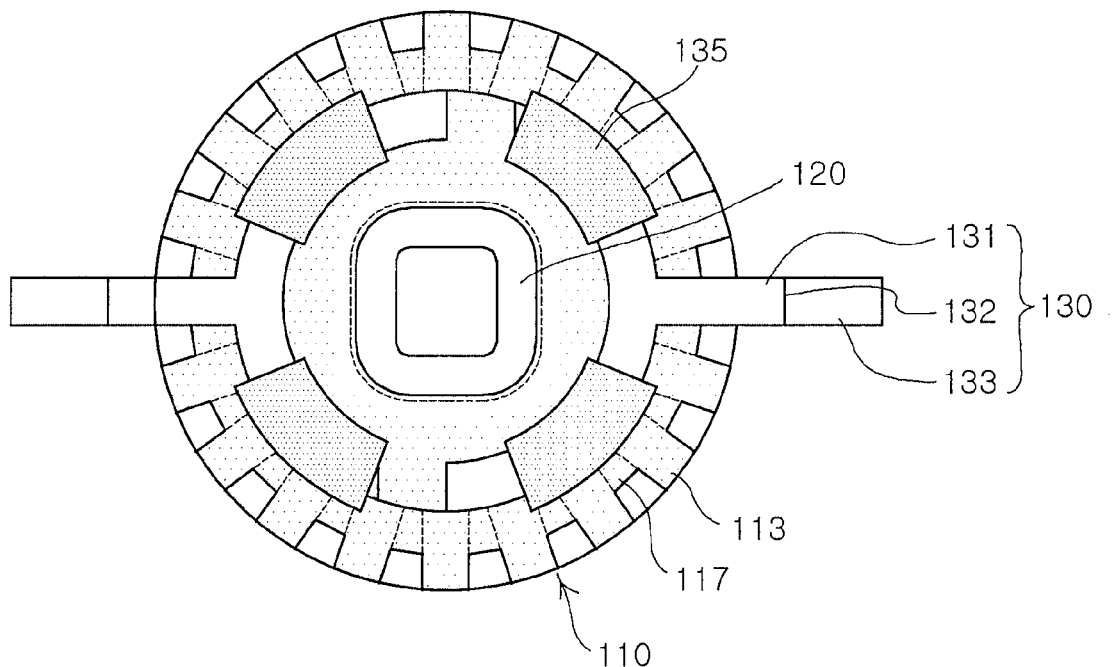
FIG. 2B is a view illustrating the LED package, shown in FIG. 1, after the molding unit is filled.

FIG. 1 is a lateral view illustrating an LED package according to an exemplary embodiment of the invention. FIG. 2A is a view illustrating the LED package, shown in FIG. 1, before a molding unit is filled. FIG. 2B is a view illustrating the LED package, shown in FIG. 1, after the molding unit is filled.

Referring to FIGS. 1 and 2B, an LED package 100 includes a body unit 110, an LED chip 140, lead frames 130, molding materials 117, molding fixing units 135 and a reflection unit 120.

The body unit 110 has thermal pins 113 that protrude from an outer circumferential surface thereof in a radial manner. Molding materials filling spaces 115 are created between the plurality of thermal pins 113. The molding materials 117 fill in the molding materials filling spaces 115. When the molding materials 117 are injected, an external mold, which is separately manufactured, may be provided outside the body unit 110 so as to maintain the shape of the molding materials 117.

Therefore, the plurality of thermal pins 113, formed on the body unit 110, increase the contact area contacting the atmosphere so that the heat generated from the LED chip 140 can be easily dissipated to the outside.

The lead frames 130 are mounted onto the edges of the body unit 110 and serve as a frame for establishing stable electrical connections with the LED chip 140.

The LED chip 140 is mounted onto the body unit 110. Specifically, the LED chip 140 is received within a cavity 123. Light emitted from the LED chip 140 is reflected outwards by the reflection unit 120 that forms the cavity 123.

As for the LED chip 140, a typical LED chip is used. Preferably, a GaN-based LED chip may be used.

The upper surfaces of the LED chip 140 and the lead frames 130 are electrically connected to each other by wire bonding using wires 150. Here, the wires 150 may be connected to portions of the lead frames 130 except for the molding fixing units 135. The wires 150 usually consist of gold (Au).

However, the materials of the wires 150 are not limited to gold. The wires 150 may consist of various kinds of materials according to the designers' intentions.

The lead frame 130 includes a mounting portion 131, an outer bent portion 132 and a lower bent portion 133. The mounting portion 131 is provided at the upper side of the body unit 110. The outer bent portion 132 is bent and extends in a perpendicular direction from the end of the mounting portion 131, that is, along a longitudinal direction of the outside of the body unit 110. The lower bent portion 133 is bent and extends in the perpendicular direction from the end of the outer bent portion 132.

The lead frames 130 are preferably formed of Cu having excellent thermal conductivity so as to effectively dissipate heat generated from the LED chip 140 that is mounted within the cavity 123.

Further, a lens 160 is coupled to the top of the body unit 110 that covers the mounting portions 131 of the lead frames 130 connected to the LED chip 140 by the wires 150. The lens 160 is provided to emit light emitted from the LED chip 140 at a greater radiation angle.

As shown in FIG. 2A, the molding materials filling spaces 115 are created between the thermal pins 113 provided on the body unit 110.

As shown in FIG. 2B, the molding materials 117 are injected between the filling spaces 115, to the bottom of the body unit 110, to the top of the body unit 110 and between the lead frames 130.

The molding fixing units 135 are further formed on the upper surfaces of the mounting portions 131 of the lead frames 130 so that the lead frames 130 are fixed to the body unit 110.

Preferably, when the molding materials 117 fill in the molding materials filling spaces 115 formed between the thermal pins 113, the molding materials 117 fill in parts of the molding materials filling spaces 115 by the use of the external mold.

Figure 3:
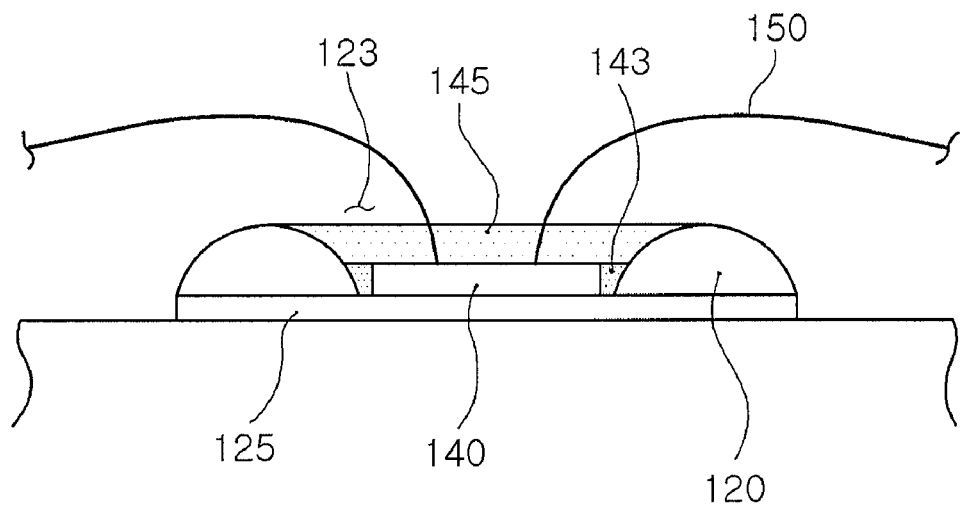
FIG. 3 is a partial lateral view illustrating a reflection unit of an LED package according to an exemplary embodiment of the present invention.

FIG. 3 is a partial lateral view illustrating a reflection unit of an LED package according to an exemplary embodiment of the invention.

Referring to FIG. 3, filling materials 143 are introduced into the cavity 123 so as to protect the LED chip 140. The filling materials 143 may be formed of transmissive resins having high light transmission characteristics, for example, silicon resins or epoxy resins.

At least one phosphor 145 may be further coated onto the top of the filling materials 143 so that a light source, provided in the backlight unit, emits white light.

Further, the filling materials 143 may be the same material as the phosphor 145. Here, instead of injecting filling materials or phosphors between the LED chip 140 and the reflection unit 120, phosphors may be slightly coated onto only the surface of the LED chip 140.

The reflection unit 120 is formed of metallic materials. Even when the inside of the cavity 123 within which the LED chip 140 is received is exposed at high temperatures for long periods of time due to the LED chip 140, the reflection unit 120 is not easily susceptible to discoloration. Therefore, the reflection unit 120 prevents a reduction in luminance of the LED package to thereby extend the life span of the LED package.

A substrate 125 is provided under the reflection unit 120. The substrate 125 transfers to the body unit 110, heat generated when the LED chip 140, mounted within the cavity 123, emits light. Here, the substrate 125 may be formed of metals having excellent thermal conductivity, for example, copper, silver, aluminum, iron, nickel or tungsten.

Here, the reflection unit 120 has a semicircular cross-section. The reflection unit 120 that faces the LED chip 140 may have a curved cross-section including the semicircular cross-section.

In comparison with the reflection unit 120 facing the LED chip 140, whose cross-section has straight contours, a reflection unit that has a cross-section with curved contours increases the levels of both light emissions and the values of the radiation angle.

Figure 4:
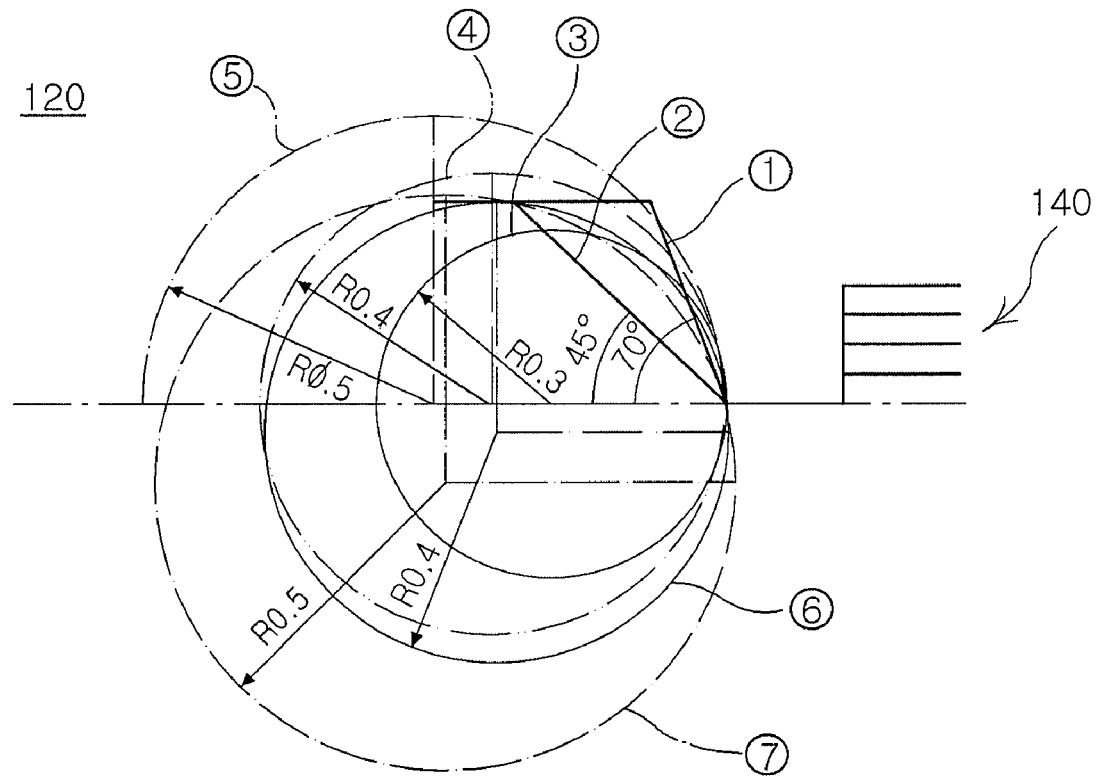
FIGS. 4 through 6 are views illustrating experimental results varying according to the shape of a reflection unit of an LED package according to an exemplary embodiment of the present invention.
Figure 5:
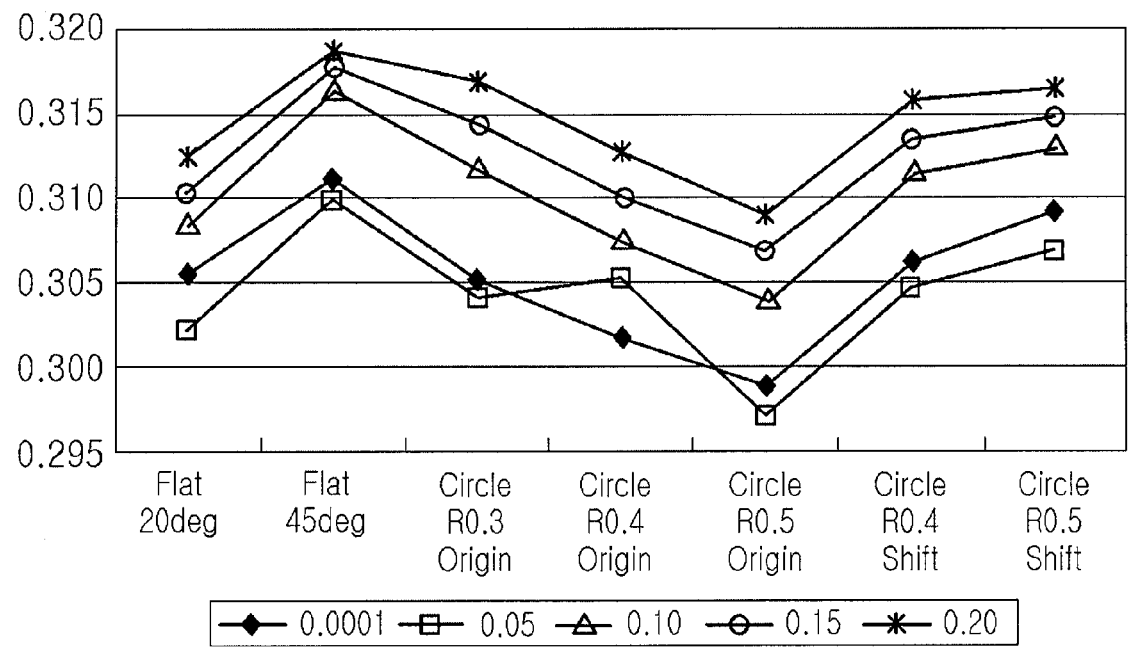
Figure 6:
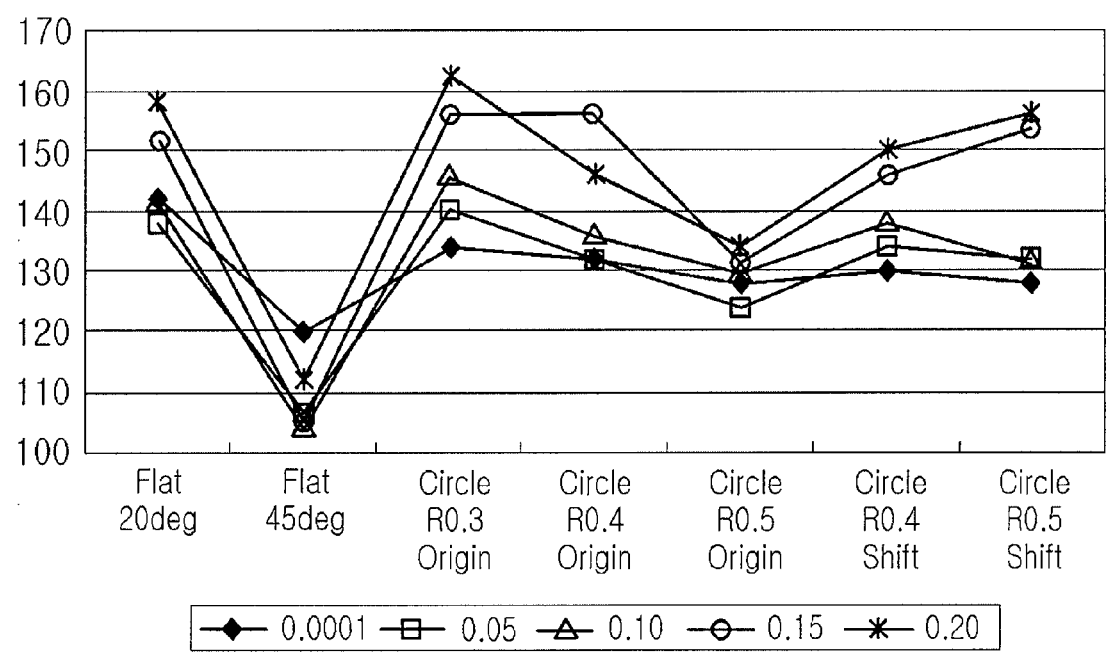

FIGS. 4 through 6 are views illustrating the results of experiments that vary according to the shape of a reflection unit of an LED package according to an exemplary embodiment of the invention.

Referring to FIG. 4, experiments were conducted on the intensity and radiation angle using seven variants of the reflection unit 120. The seven variant shapes of the reflection unit 120 include a flat cross-section with an angle of inclination of 20 degrees (70 degrees on the basis of the opposite side) (①), a flat cross-section with an inclination angle of 45 degrees (②), a semicircular cross-section with a radius of 0.3 mm (③), a semicircular cross-section with a radius of 0.4 mm (④), a semicircular cross-section with a radius of 0.5 mm (⑤), a semicircular cross-section with a radius of 0.4 mm while the center of the circle is shifted lower than the LED chip 140 (⑥), and a semicircular cross-section with a radius of 0.5 mm while the center of the circle is shifted lower than the LED chip 140 (⑦).

FIG. 5 is a graph constructed using Table 1 showing data obtained by performing experiments on luminous intensity according to the shape of the reflection unit of the LED package, shown in FIG. 4.

TABLE 1

|  | 0.0001 | 0.05 | 0.10 | 0.15 | 0.20 |
|---|---|---|---|---|---|
| Flat 20 degrees | 0.30548 | 0.30226 | 0.30872 | 0.31021 | 0.31249 |
| Flat 45 degrees | 0.31112 | 0.30993 | 0.31646 | 0.31788 | 0.31872 |
| Semicircular R0.3 | 0.30513 | 0.30416 | 0.31175 | 0.31440 | 0.31697 |
| Semicircular R0.4 | 0.30163 | 0.30522 | 0.30753 | 0.31014 | 0.31278 |
| Semicircular R0.5 | 0.29879 | 0.29711 | 0.30403 | 0.30692 | 0.30897 |
| Semicircular R0.4 (shift) | 0.30616 | 0.30467 | 0.31152 | 0.31356 | 0.31578 |
| Semicircular R0.5 (shift) | 0.30915 | 0.30685 | 0.31312 | 0.31480 | 0.31644 |

In the graph in FIG. 5 constructed using Table 1, the X-axis represents the shape of the reflection unit, and the Y-axis represents the intensity of light reflected outwards according to the shape of the reflection unit. Individual line graphs are illustrated by different shapes, varying according to the heights of the LED chip 140.

It can be found that the differences in height of the LED chip 140 do not change the intensity and the radiation angle according to the shape of the reflection unit 120.

Furthermore, it can be shown that shapes ②, ③ and ⑦ of the reflection unit have almost the same intensity value. Specifically, when the LED chip is 0.2 mm high, the reflection unit having the shape ② has a luminous intensity of 0.31872, which is slightly greater than the shape ⑥ (0.31578) or the shape ⑦ (0.31644). However, this difference is small enough to be ignored.

FIG. 6 is a graph constructed using Table 2 showing data obtained by performing experiments on the radiation angle of emitted light according to the shape of the reflection unit of the LED package, shown in FIG. 4.

TABLE 2

|  | 0.001 | 0.05 | 0.10 | 0.15 | 0.20 |
|---|---|---|---|---|---|
| Flat 20 degrees | 142 | 138 | 142 | 152 | 158 |
| Flat 45 degrees | 120 | 106 | 104 | 104 | 112 |
| semicircular R0.3 | 134 | 140 | 146 | 156 | 162 |
| semicircular R0.4 | 132 | 132 | 136 | 156 | 146 |
| semicircular R0.5 | 128 | 124 | 130 | 132 | 134 |
| semicircular R0.4(shift) | 130 | 134 | 138 | 146 | 150 |
| semicircular R0.5(shift) | 128 | 132 | 132 | 154 | 156 |

In the graph in FIG. 6, constructed using Table 2, the X-axis represents the shape of the reflection unit, and the Y-axis represents a value corresponding to the radiation angle according to the shape of the reflection unit. Individual line graphs are illustrated by different shapes, varying according to the heights of the LED chip 140. Here, the higher the value corresponding to the orientation angle is, the wider the emission range is.

Here, when the LED chip 140 is 0.2 mm high, the radiation unit having the shape ② has a radiation angle of 112 degrees, which is significantly lower than that (150 degrees) of the shape ⑥ or that (156 degrees) of the shape ⑦. As a result, it may be impossible to reflect light from the LED chip 140 in a wide emission range.

Therefore, compared to when the reflection unit 120 has a flat cross-section, the reflection unit 120 having a semicircular cross-section (⑥ or ⑦) can reflect light in a wide emission range as well as increase light emission efficiency.

However, the shape of the cross-section of the reflection unit 120 is not limited thereto, and the reflective surface that faces the LED chip 140 may have a round shape, according to the designers' intentions.

Figure 7:
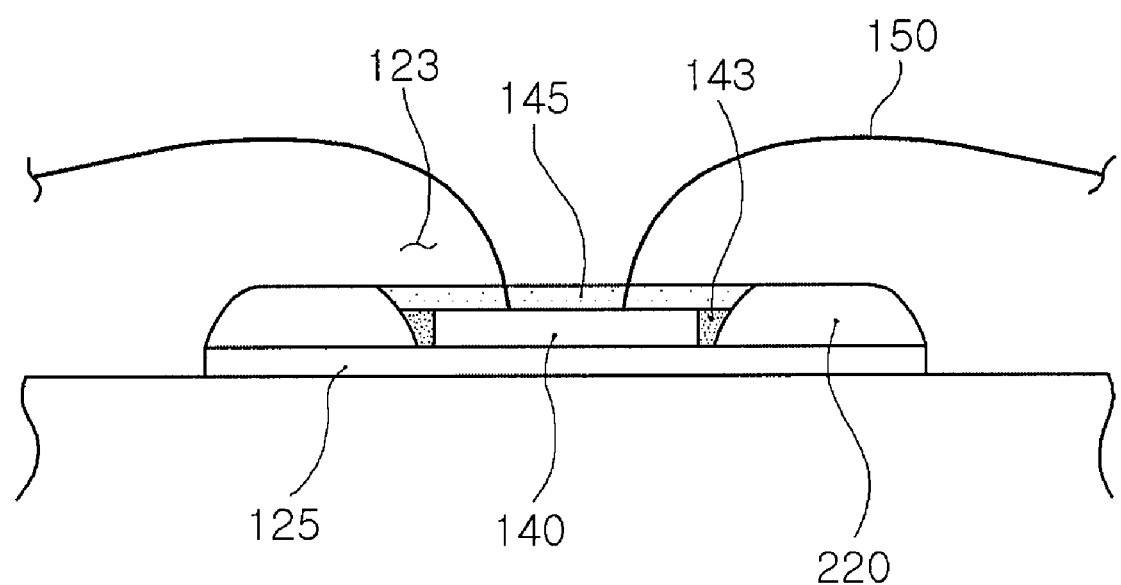
FIG. 7 is a cross-sectional view illustrating an LED package according to another exemplary embodiment of the invention.

FIG. 7 is a cross-sectional view illustrating an LED package according to another exemplary embodiment of the invention.

Referring to FIG. 7, an LED package 100 includes a body unit, an LED chip, lead frames, molding materials, a molding fixing unit and a reflection unit 220.

Here, since the body unit, the LED chip, the lead frames and the molding materials are the same as in the above-described embodiment of the invention, a description thereof will be omitted.

The reflection unit 220 is formed of metallic materials. Even when the inside of the cavity 123 within which the LED chip 140 is received is exposed at high temperatures for long periods of time due to the LED chip 140, the reflection unit 220 is not easily susceptible to discoloration. Therefore, the reflection unit 220 prevents a reduction in luminance of the LED package to thereby extend the life span of the LED package.

A substrate 125 is provided under the reflection unit 220. The substrate 125 transfers heat generated when the LED chip 140 mounted within the cavity 123 emits light to the body unit 110. Here, the substrate 125 may be formed of metals having excellent thermal conductivity, for example, copper, silver, aluminum, iron, nickel or tungsten.

The reflection unit 220 may have a cross-section with round edges and a flat top. Therefore, when injecting the filling materials 145 and the phosphors 143 into the cavity 123 of the reflection unit 220, it is easy to check the filling depth since the reflection unit 220 has a flat top. Thus, it is easier to fill the phosphors 143 and the filling materials 145.

As set forth above, according to exemplary embodiments of the invention, in an LED package, a reflection unit has a curved cross-section to increase the efficiency of emitting light generated from an LED chip to the outside and reflect light in a wide emission range.

Further, an LED package according to an exemplary embodiment has a plurality of thermal pins protruding from an outer circumferential surface of a radiator in a radial manner to increase the area contacting the atmosphere to thereby maximize heat dissipation of the LED package.

While the present invention has been shown and described in connection with the exemplary embodiments, it will be apparent to those skilled in the art that modifications and variations can be made without departing from the spirit and scope of the invention as defined by the appended claims.

What is claimed is:

1. A light emitting diode (LED) package comprising:
   a body unit having a plurality of thermal pins protruding from an outer surface thereof in a radial direction;
   an LED chip mounted on an upper side of the body unit;
   lead frames mounted on the upper side of the body unit and electrically connected to the LED chip;
   a molding material for insulting the body unit with the lead frames; and
   a reflection unit formed on the upper side of the body unit, the reflection unit having a cavity to receive the LED chip therein and reflecting light emitted from the LED chip to the outside, wherein:
   the reflection unit has a curved cross-section, and ends of the plurality of thermal pins protrude from the molding material in a radial direction and are exposed to the outside.

2. The LED package of claim 1, wherein the reflection unit has a semicircular cross-section.

3. The LED package of claim 1, wherein the reflection unit has a cross-section having rounded edges and a flat top.

4. The LED package of claim 1, wherein:
filling spaces for the molding material are created between the thermal pins, and
the molding material is injected between the filling spaces, into the bottom of the body unit and the top of the body unit and between the lead frames.

5. The LED package of claim 1, wherein each of the lead frames comprises a mounting portion provided on the upper side of the body unit, an outer bent portion extending in a perpendicular direction from the end of the mounting portion, and a lower bent portion extending in the perpendicular direction from the end of the outer bent portion.

6. The LED package of claim 1, wherein a molding fixing unit is further provided onto an upper surface of each of the lead frames so that the each of the lead frames is fixed to the body unit.

7. The LED package of claim 1, further comprising filling materials introduced in the cavity to protect the LED chip.

8. The LED package of claim 7, further comprising at least one phosphor coated on the top of the filling materials.

* * * * *